(12) United States Patent
Yang et al.

(10) Patent No.: US 12,169,675 B2
(45) Date of Patent: Dec. 17, 2024

(54) AUTOMATIC GENERATION OF LAYOUTS FOR ANALOG INTEGRATED CIRCUITS

(71) Applicant: Taiwan Semiconductor Manufacturing Company, Ltd., Hsinchu (TW)

(72) Inventors: Yu-Tao Yang, Zhubei (TW); Wen-Shen Chou, Zhubei (TW); Yung-Chow Peng, Hsinchu (TW); Yung-Hsu Chuang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/362,574

(22) Filed: Jul. 31, 2023

(65) Prior Publication Data

US 2024/0028810 A1 Jan. 25, 2024

Related U.S. Application Data

(62) Division of application No. 17/212,728, filed on Mar. 25, 2021, now Pat. No. 11,763,060.

(51) Int. Cl.
*G06F 30/39* (2020.01)
*G06F 11/32* (2006.01)
*G06F 30/392* (2020.01)
*G06F 30/398* (2020.01)

(52) U.S. Cl.
CPC .......... *G06F 30/392* (2020.01); *G06F 11/324* (2013.01); *G06F 30/398* (2020.01)

(58) Field of Classification Search
CPC ...... G06F 30/39; G06F 30/392; G06F 11/324; G06F 30/398; G06F 30/36; G06F 2115/12
USPC ........................................................ 716/119
See application file for complete search history.

(56) References Cited

U.S. PATENT DOCUMENTS

| | | |
|---|---|---|
| 11,429,775 B1 | 8/2022 | Chang et al. |
| 11,763,060 B2 | 9/2023 | Yang et al. |
| 11,816,414 B2 | 11/2023 | Chang et al. |
| 2006/0265675 A1 | 11/2006 | Wang |
| 2012/0273899 A1* | 11/2012 | Wann .................. H01L 27/0207 257/E27.06 |
| 2013/0145329 A1 | 6/2013 | Brandt et al. |
| 2015/0143309 A1 | 5/2015 | De Dood et al. |
| 2021/0019463 A1 | 1/2021 | Chen et al. |
| 2022/0358273 A1 | 11/2022 | Chang et al. |

* cited by examiner

*Primary Examiner* — Paul Dinh

(74) *Attorney, Agent, or Firm* — Merchant & Gould P.C.

(57) ABSTRACT

Techniques for generating one or more non-final layouts for an analog integrated circuit are disclosed. The techniques include generating a non-final layout of an analog integrated circuit based on device specifications, partitioning the non-final layout into a plurality of subcells, merging the verified sub-cells to form a merged layout of the analog integrated circuit, and performing quality control checks on the merged layout. Additionally or alternatively, generating the non-final layout can include determining an allowable spacing between adjacent cells of different cell types or inserting one or more filler cells into a filler zone in the non-final layout.

20 Claims, 16 Drawing Sheets

| Unit: nm | Power track | Signal track |
|---|---|---|
| C280 Core | 14x9 | |
| C560 Core | 40x2 | 28x9 |
| C560 IO | 42x2 | 20x5 |
| C840 IO | 60x2 | 28x7 |

|     | Default | 10+13+10 | Default | 10+13+10 | Default |     |
|-----|---------|----------|---------|----------|---------|-----|
| R0  | BGC     | BGH      |         |          | BGC     |     |
| R0  | BGV     | CP280    | TAP     | CP280    | BGV     | 1   |
| R0  | BGV     | CN280    | TAP     | CN280    | BGV     | 2   |
| MX  | BGV     | CN280    | TAP     | CN280    | BGV     | 3   |
| MX  | BGV     | CP280    | TAP     | CP280    | BGV     | 4   |
| R0  | BGV     | CP280    | TAP     | CP280    | BGV     | 5   |
| R0  | BGV     | CN280    | TAP     | CN280    | BGV     | 6   |
| MX  | BGV     | CN280    | TAP     | CN280    | BGV     | 7   |
| MX  | BGV     | CP280    | TAP     | CP280    | BGV     | 8   |
| R0  | BGV     | CP280    | TAP     | CP280    | BGV     | 9   |
| R0  | BGV     | CN280    | TAP     | CN280    | BGV     | 10  |
| MX  | BGV     | CN280    | TAP     | CN280    | BGV     | 11  |
| MX  | BGV     | CP280    | TAP     | CP280    | BGV     | 12  |
| R0  | BGV     | CP280    | TAP     | CP280    | BGV     | 13  |
| R0  | BGV     | CN280    | TAP     | CN280    | BGV     | 14  |
| MX  | BGV     | CN280    | TAP     | CN280    | BGV     | 15  |
| MX  | BGV     | CP280    | TAP     | CP280    | BGV     | 16  |
| MX  | BGC     | BGH      |         |          | BGC     |     |

FIG. 8

AUTOMATIC GENERATION OF LAYOUTS FOR ANALOG INTEGRATED CIRCUITS

CROSS-REFERENCE TO RELATED APPLICATION(S)

This application is a divisional application of U.S. patent application Ser. No. 17/212,728, filed Mar. 25, 2021, now U.S. Pat. No. 11,763,060, which is hereby incorporated in its entirety by reference.

BACKGROUND

Over the last several decades the semiconductor fabrication industry has been driven by a continual demand for greater performance (e.g., increased processing speed, memory capacity, etc.), a shrinking form factor, extended battery life, and lower cost. In response to this demand, the industry has continually reduced a size of semiconductor device components, such that modern-day integrated circuit (IC) devices may comprise millions or billions of semiconductor devices arranged on a single semiconductor die.

As such, integrated circuits are enormously complicated. To ensure an IC functions properly and reliably, and can be produced with an acceptable yield, the design of the IC must meet certain constraints, or design rules. The design rules define various parameters for the IC. Example design rules include minimum widths for various components (e.g., wells, transistors), minimum spacing requirements, gate lengths, cell heights, and other geometric constraints.

Due to the complexity of the design and manufacturing processes, as well as market pressure to produce designs more rapidly, automated design tools are used extensively in the design process. However, some design processes still require manual operations, and some of these manual operations must be performed repeatedly due to design changes that occur during the design process.

BRIEF DESCRIPTION OF THE DRAWINGS

Aspects of the present disclosure are best understood by the following detailed description in conjunction with the accompanying drawings, where like reference numerals designate like structural elements. It is noted that various features in the drawings are not drawn to scale. In fact, the dimensions of the various features may be arbitrarily increased or reduced for clarity of discussion.

FIG. 8 depicts a portion of example device specifications for an analog integrated circuit in accordance with some embodiments;

DETAILED DESCRIPTION

Figure 1:
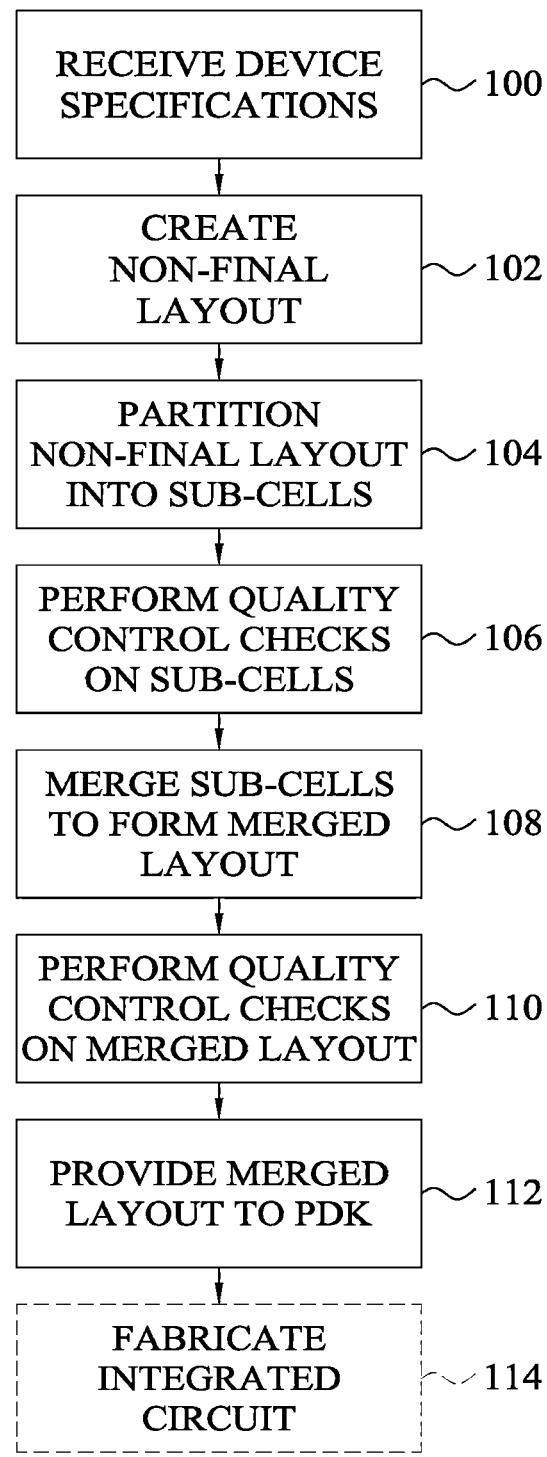
FIG. 1 depicts a flowchart of an example design process in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "under", "upper," "top," "bottom," "front," "back," and the like, may be used herein for ease of description to describe one element or feature's relationship to another element(s) or feature(s) as illustrated in the Figure(s). The spatially relative terms are intended to encompass different orientations of the device in use or operation in addition to the orientation depicted in the figures. Because components in various embodiments can be positioned in a number of different orientations, the directional terminology is used for purposes of illustration only and is in no way limiting. When used in conjunction with layers of an integrated circuit, semiconductor device, or electronic device, the directional terminology is intended to be construed broadly, and therefore should not be interpreted to preclude the presence of one or more intervening layers or other intervening features or elements. Thus, a given layer that is described herein as being formed on, over, or under, or disposed on, over, or under another layer may be separated from the latter layer by one or more additional layers.

Embodiments disclosed herein provide techniques for automatically generating layouts for analog integrated circuits. An integrated circuit is typically constructed using cells, where a cell can contain some or all of a circuit or a component. An analog cell is a cell in which some or all of the cell includes an analog circuit or analog component. An analog cell is also known as a Pcell (parameterized cell) in which one or more parameters of the analog cell are definable (e.g., parameter values can vary). In one embodiment, some or all of a non-final layout for an integrated circuit is constructed with analog cells.

These and other embodiments are discussed below with reference to FIGS. 1-18. However, those skilled in the art will readily appreciate that the detailed description given herein with respect to these Figures is for explanatory purposes only and should not be construed as limiting.

FIG. 1 depicts a flowchart of an example design process in accordance with some embodiments. Although FIG. 1 is described in conjunction with an analog integrated circuit, the process can be used for analog cells in other embodiments. Initially, as shown in block 100, device specifications for an analog integrated circuit (IC) are received. The device specifications define one or more of the parameters of the analog IC. Example parameters include, but are not limited to, cell type(s), minimum widths for various components (e.g., wells, transistors), minimum spacing requirements, gate lengths, cell heights, number of fins (nfin), number of fingers (e.g., number of transistors), and other geometric constraints.

Next, as shown in block 102, a non-final layout is generated based on the device specification. The non-final layout is a layout that includes combinations of key specifications. The non-final layout is then partitioned into sub-cells at block 104. In one embodiment, the sub-cells are generated based on the device specification. Each sub-cell is a smaller circuit or component of the analog IC. In some embodiments, all of the sub-cells constitute the analog IC. An example process of generating the sub-cells is described in more detail in conjunction with FIG. 2.

One or more verification or quality control checks are performed on each sub-cell at block 106. In one embodiment, verification of the sub-cells includes design rule checking (DRC), layout versus layout (LVL) verification, and/or layout vs. schematic (LVS) verification. Once the sub-cells are verified, the sub-cells are merged to form a merged layout of the analog IC or analog cell (block 108). Essentially, merging the sub-cells constructs or re-forms the non-final layout of the analog IC. The merged layout is examined and/or tested for quality control and manufacturability at block 110. In one embodiment, verification of the merged layout includes DRC, LVS verification, and/or LVL verification. At block 112, the merged layout is provided to a process design kit (PDK). For example, the verified sub-cells and/or the verified merged layout are providing to a library for storage. The library can be accessed when other analog IC are designed. Based on the PDK, the integrated circuit is fabricated at block 114.

Figure 2:
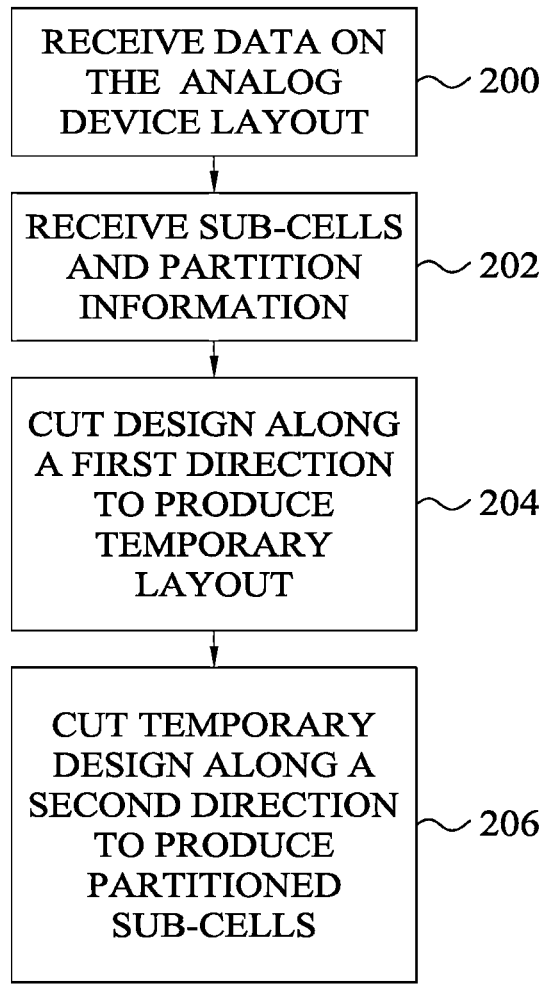
FIG. 2 illustrates a flowchart of an example method of generating sub-cells in accordance with some embodiments.

FIG. 2 illustrates a flowchart of an example method of generating sub-cells in accordance with some embodiments. Although FIG. 2 is described in conjunction with an analog integrated circuit, the process can be used for analog cells in other embodiments. Initially, as shown in block 200, data on the layout of the analog integrated circuit is received. The data includes the layout of the analog IC, and some or all of the information in the device specifications (see block 100 in FIG. 1). For example, the information sets parameters such as cell type(s), gate length, nfin number, spacing minimums, and the like. In one example embodiment, the data is contained in a graphic design system (gds) file that is created by computer aided design (CAD) software.

Next, as shown in block 202, partition information for the layout of the analog cell is received. The partition information relates to the partitioning of the sub-cells in the layout. The partition information can include information such as cell name (e.g., cell type), cut locations/distances for one direction, and cut locations/distances for another direction. In one embodiment, the partition information is stored in a file that is received by a computing system that partitions the layout (see e.g., FIGS. 13 and 14). A text file is an example of a file that is received at block 202. A user interface can be provided on a display of the computing system and provides a mechanism or input element(s) to submit the partition information. Additionally, the user interface allows the partition information to be modified quickly and easily. An example user interface is described in more detail in conjunction with FIG. 3.

When the layout of the analog integrated circuit is partitioned, the cut location or locations are determined and the layout is cut along a first direction at the one or more determined locations to produce a temporary layout (block 204). At block 206, one or more other cut locations are determined and cuts are made in the temporary layout along a second direction at the one or more determined locations to produce partitioned sub-cells (block 206). In one embodiment, the first direction is horizontal direction (e.g., x direction) and the second direction is a vertical direction (e.g., y direction), and each cut is specified by a starting point and an ending point (e.g., specifying a distance of the cut). The data for the cuts can be saved prior to, or after the partitioning operation. Table 1 provides a non-limiting example of the partition information that defines the cuts to be made in a layout.

TABLE 1

| Name | Xrange Start | Xrange End | Yrange Start | Yrange End |
|---|---|---|---|---|
| Sub-cell 1 | 0 | 0.51 | 0 | −0.28 |
| Sub-cell 2 | 0.51 | 1.02 | 0 | −0.28 |
| Sub-cell 3 | 1.02 | 1.53 | 0 | −0.28 |

Next, as shown in block 208, quality control operations are performed on the partitioned sub-cells. The quality control processes can include, but are not limited to, DRC, LVS verification, and LVL verification.

Figure 3:
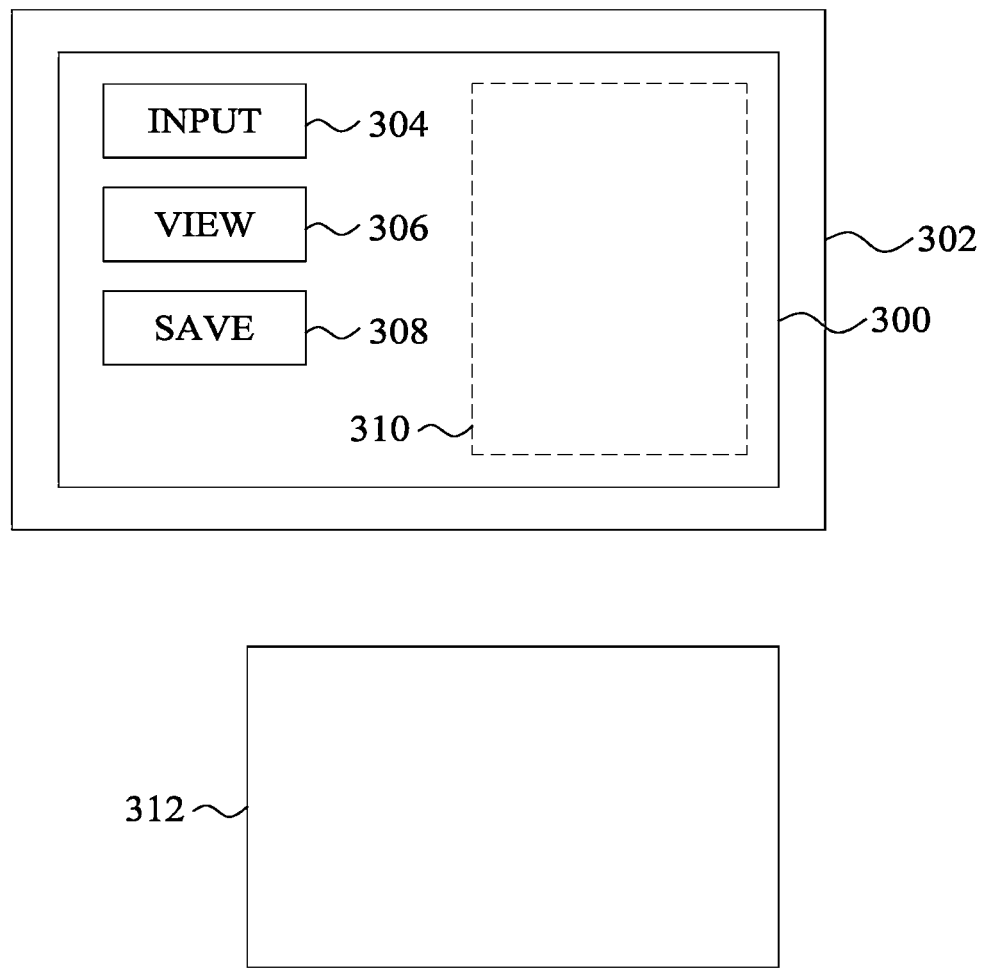
FIG. 3 depicts an example user interface that can be used to receive the device specifications and/or the device layout in accordance with some embodiments.

FIG. 3 depicts an example user interface that can be used to receive the device specifications and/or the device layout in accordance with some embodiments. In one embodiment, the device specification is received at block 100 in FIG. 1 and the data on the device layout is input at block 200 in FIG. 2. An example user interface 300 is displayed on a display 302 of a computing device (e.g., system 1600 in FIG. 16). The user interface 300 includes an input element 304, a view element 306, and a save element 308. The input element 304 enables a user to input information, such as the device layout and the device specification, to a computer assisted design program or an automated design tool (e.g., instructions 1606 in FIG. 16). The input element 304 can be implemented as any suitable input element that allows a user to input or submit information to a computing system. For example, the input element 304 can be a drop down menu that enables the user to select a file to input (e.g., upload), a list box, a text box, or an input area where a user can drag and drop the information to be submitted.

The user can view the submitted information by selecting or activating the view element 306. In response to activating the view element 306, the information can be displayed in a panel 310 within the user interface 300. Alternatively, the information may be presented in a panel 312 that is separate from the user interface 300 (e.g., another user interface view). In some embodiments, the user can modify or edit the information displayed in the panel 310 or the panel 312. After editing the information, the user can save the information to a storage device by selecting or activating the save element 308.

Other embodiments can include additional elements in the user interface. For example, a user interface can include a delete element that deletes a selected section of the information or all of the information. Additionally or alternatively, the user interface may include a send element that enables a user to send the information to the computing device that partitions the analog integrated circuit and/or to another user.

Figures 4A, 4B:
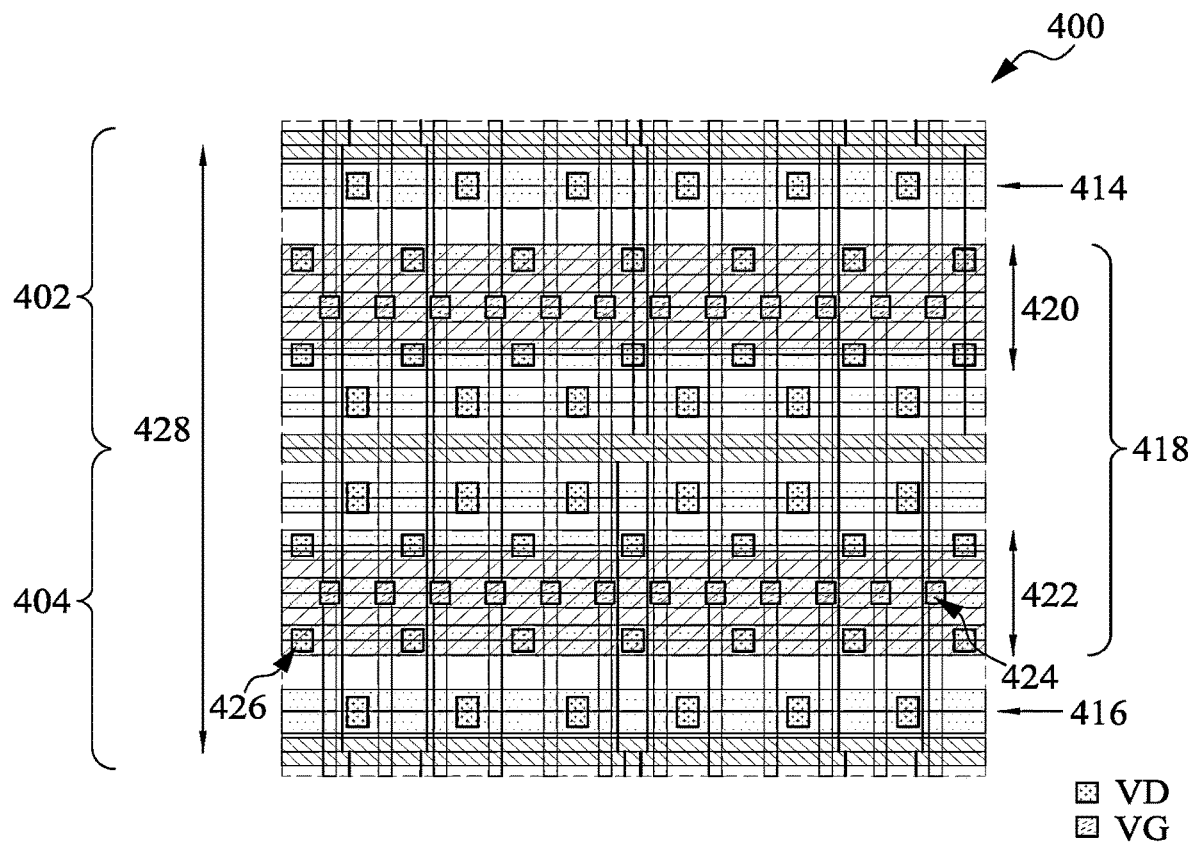
FIG. 4A illustrates an example complementary metal-oxide semiconductor (CMOS) pair in accordance with some embodiments.
FIG. 4B depicts a table of example cell types in accordance with some embodiments.

FIG. 4A illustrates an example complementary metal-oxide semiconductor (CMOS) pair in accordance with some embodiments. The CMOS pair is used to describe several considerations when generating a non-final layout. The CMOS pair 400 includes a PMOS cell 402 and an NMOS cell 404. In one embodiment, the via-to-diffusion (VD) and via-to-gate (VG) combinations and all of the different first metal layer plans (e.g., M0 layer plans) are considered. For example, FIG. 4B lists example M0 layer plans for four different cell types ("unit: nm"). The first cell type 406 is a core cell having a cell height of 280 nm, 9 power tracks at 14 nm, and 9 signal tracks at 14 nm. The second cell type 408 is another core cell having a cell height of 560 nm, 2 power tracks at 40 nm, and 9 signal tracks at 28 nm. The third cell type 410 is an IO cell having a cell height of 560 nm, 2 power tracks at 42 nm, and 5 signal tracks at 20 nm. The fourth cell type 412 is an IO cell having a cell height of 840 nm, 2 power tracks at 60 nm, and 7 signal tracks at 28 nm.

Returning to FIG. 4A, the non-final layout 400 is shown for the second cell type 408. Other considerations for the non-final layout 400 include a first power track 414 and a second power track 416. The first and the second power tracks 414, 416 provide one or more voltage sources to the cell, such as VDD and VSS. In one embodiment, the first and the second power tracks 414, 416 are 40 nm.

The non-final layout 400 further includes 9 signal tracks at 28 nm in area 418. A first active diffusion region 420 is included in the PMOS cell 402. A second active diffusion region 422 is included in the NMOS cell 404. In one embodiment, the first and the second active diffusion regions 420, 422 each include four fins. Contacts 424 represents the VG-on-active diffusion region contacts and contacts 426 represents the VD contacts. In one embodiment, the cell height 428 of the non-final layout 400 is 560 nm, where the cell height for each of the PMOS cell 402 and the NMOS cell 404 is 280 nm.

Figure 5:
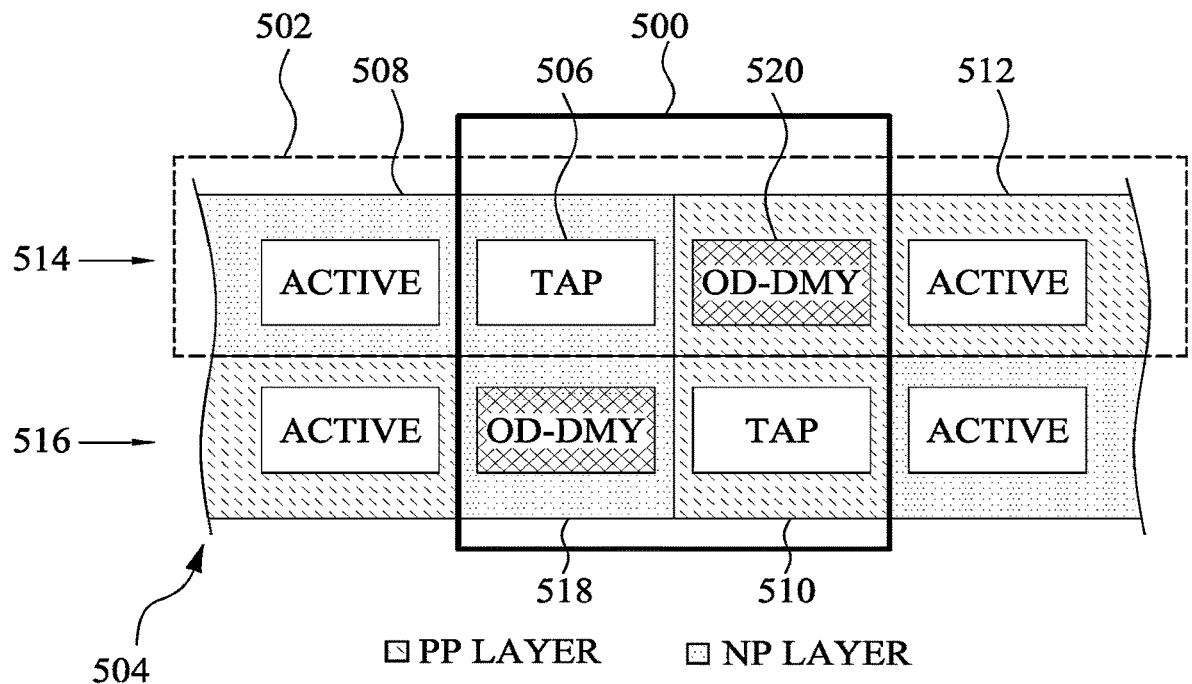
FIG. 5 illustrates an example two active diffusion region tap cell in accordance with some embodiments.

FIG. 5 depicts an example two active diffusion region tap cell in accordance with some embodiments. A tap cell is a cell type for a cell that connects to a bulk connection. The two active diffusion region tap cell 500 is formed in part in a well 502 and in a substrate 504. The well 502 and the substrate 504 can be any suitable well and substrate. For example, the well 502 can be an n-type well and the substrate 504 may be a silicon substrate. In other embodiments, the well 502 can be a p-type well and the substrate 504 may be a semiconductor substrate (e.g., Silicon on Insulator substrate) or a compound semiconductor substrate (e.g., gallium arsenide substrate).

The two active diffusion or oxide diffusion (OD) region tap cell 500 includes a first active diffusion region 506 disposed in an np layer 508 and a second active diffusion region 510 formed in a pp layer 512. The np layer 508 is a layer with n+ ion implantation and the pp layer 512 is a layer with p+ ion implantation. The first active diffusion region 506 and the second active diffusion region 510 are positioned in different lines of active diffusion regions 514, 516.

The two active diffusion region tap cell 500 further includes a first OD-DMY cell 518 disposed in the np layer 508 and a second OD-DMY cell 520 formed in the pp layer 512. In the illustrated embodiment, the first OD-DMY cell 518 and the second OD-DMY cell 520 are non-functioning cells that act as filler cells to enable the two active diffusion region tap cell 500 to pass one or more DRCs. The first active diffusion region 506 and the second active diffusion region 510 are positioned in opposite corners of the two active diffusion region tap cell 500, and the first OD-DMY cell 518 and the second OD-DMY cell 520 are disposed at the other opposite corners of the two active diffusion region tap cell 500.

Figure 6:
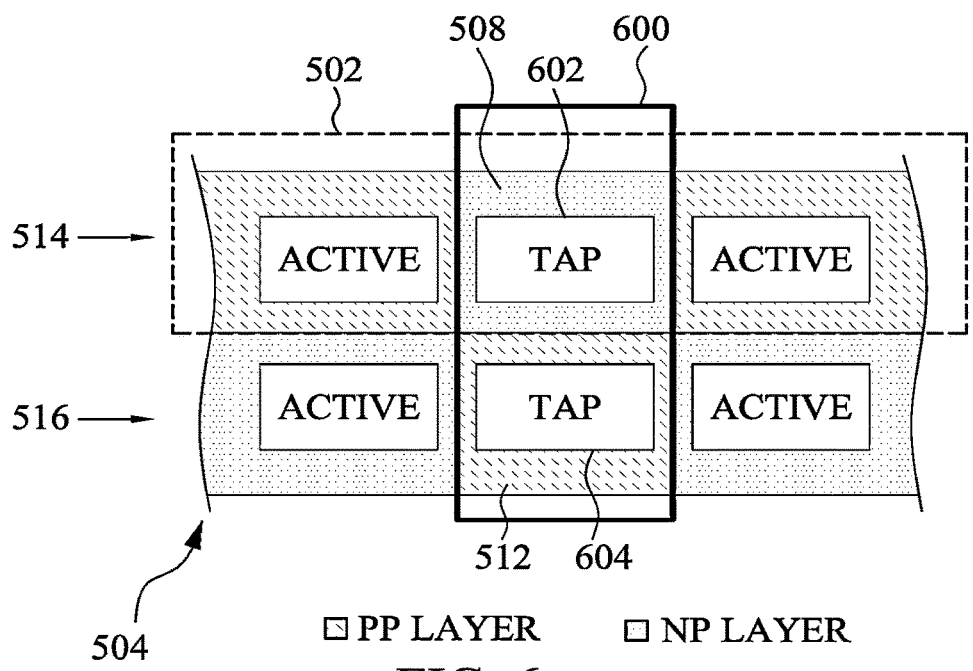
FIG. 6 depicts an example one active diffusion region tap cell in accordance with some embodiments.

The two active diffusion region tap cell 500 is typically larger than a one active diffusion region tap cell (see FIG. 6). For example, the two active diffusion region tap cell 500 can be greater than twenty CPP (contacted poly pitch) (e.g., the transistor gate pitch). Additionally or alternatively, in some situations, the two active diffusion region tap cell 500 can suffer from less noise but may be slower than a one active diffusion region tap cell. In one embodiment, the np layer 508 and the pp layer 512 have similar shapes and sizes compared to the np layer and the pp layer in the one active diffusion region tap cell (FIG. 6).

FIG. 6 illustrates an example one active diffusion region tap cell in accordance with some embodiments. Like the two active diffusion region tap cell 500 shown in FIG. 5, the one active diffusion region tap cell 600 is formed in part in a well 502 and in a substrate 504. The well 502 and the substrate 504 can be any suitable well and substrate.

The one active diffusion region tap cell 600 includes a first-active diffusion region tap cell 602 disposed in an np layer 508 and a second active diffusion region tap cell 604 formed in a pp layer 512. The first active diffusion region tap cell 602 and the second active diffusion region tap cell 604 are positioned in different lines of active diffusion regions 514, 516. The one active diffusion region tap cell 600 is typically smaller than a two active diffusion region tap cell (see 500 in FIG. 5). For example, the one active diffusion region tap cell 600 can be less than fifteen CPP. Additionally or alternatively, in some situations, the one active diffusion region tap cell 600 can suffer from more noise but may be faster than the two active diffusion region tap cell. In one embodiment, the np layer 508 and the pp layer 512 have different shapes and sizes compared to the np layer and the pp layer in the two active diffusion region tap cell.

Figure 7:
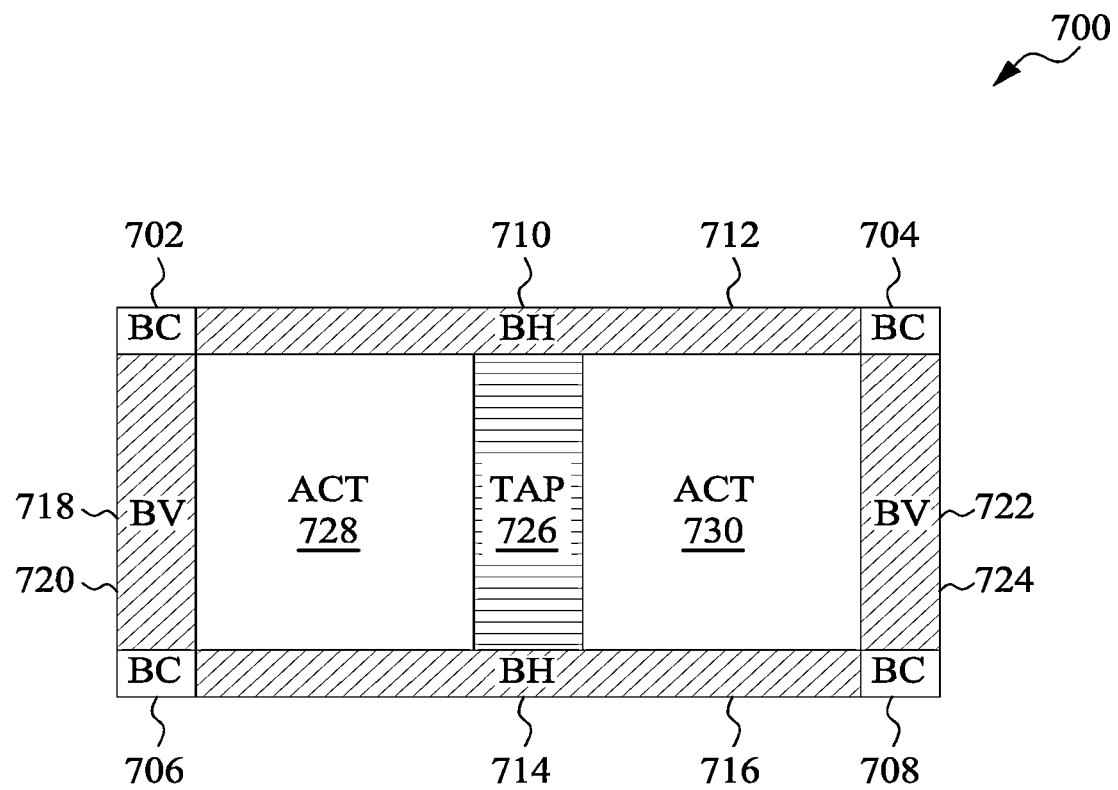
FIG. 7 illustrates an example block diagram of an analog integrated circuit in accordance with some embodiments.

FIG. 7 depicts an example block diagram of an analog integrated circuit in accordance with some embodiments. The analog IC 700 is arranged into sections of cell types, where each section includes one or more of the cell types. One section is a boundary corner (BC) section 702, 704, 706, 708 that is positioned at each corner of the analog IC 700. A boundary horizontal (BH) section 710 is disposed along the top edge 712 between the BC sections 702, 704.

A BH section 714 is positioned along the bottom edge 716 of the analog IC 700 between the BC sections 706, 708. A boundary vertical (BV) section 718 is positioned along a side edge 720 (e.g., left edge) between the BC sections 702, 706, and a BV section 722 is disposed along a side edge 724 (e.g., right edge) of the analog IC 700. The cells in the BC, BH, and BV sections 702, 704, 706, 708, 710, 714, 718, 722 are designed to protect the edges of the analog IC 700.

A TAP section 726 is positioned between two ACT sections 728, 730. The TAP section 726 and the ACT sections 728, 730 are disposed within the area that is surrounded by the BC, BH, and BV sections 702, 704, 706, 708, 710, 714, 718, 722. The TAP section 726 includes one or more tap cells that provide bulk connections. The ACT sections 728, 730 include cells that provide the circuits and components (e.g., the functionality) of the analog IC 700.

FIG. 8 illustrates a portion of an example partition information for an analog integrated circuit in accordance with some embodiments. Although FIG. 8 is described in conjunction with an analog integrated circuit, the process can be used for analog cells in other embodiments. The partition information typically includes data on the conditions associated with the non-final layout of the analog IC, such as the sub-cell types, the orientation of the sub-cells, the minimum number of rows of sub-cells, and the arrangement of the sub-cells. As described previously, the data in the partition information (e.g., the table 800) is stored in a file that is accessed when a non-final layout of an analog IC is partitioned into sub-cells.

Section 802 of the table 800 is arranged in a logical view of the sub-cells. Section 804 lists a row number for the rows of sub-cells and section 806 provides the orientation of the sub-cells in the rows. A minimum requirement of the transistor array (e.g., metal-oxide-semiconductor (MOS) array) is less than or equal to the number of rows in the table 800. Example orientations in section 806 include rotation RO (zero rotation) and rotation R180 (180 degree rotation), middle in the x direction (MX), and middle in the y direction (MY). Section 808 includes data on the fingers in the sub-cells. The number of fingers can be even or odd of a polysilicon layer (e.g., PO). For example, the values "10+13+10" define the metal-oxide-semiconductor (MOS) combinations of 10 fingers MOSDMY on right side, 13 active MOS fingers in the center, and 10 fingers MOSDMY in the left side. The terms "MOSDMY" mean a non-functioning (e.g., turned off or not activated) finger that acts as a filler.

As shown, section 802 includes sections 810, 812, 814, 816, 818. The sections 810, 812, 814, 816, 818 list the sub-cells by cell types. The cell types correspond to the sections shown in FIG. 7. The cell types include Boundary Guarding Corner (BGC), Boundary Guarding Horizontal (BGH), Boundary Guarding Vertical (BGV), TAP, CP (CH) (PMOS cell with a specified cell height (an example cell height of 280 nm is shown)), and CN (CH) (NMOS cell with a specified cell height (example cell height of 280 nm)). Partitioning the BC sections 702, 704, 706, 708 produces the BGC sub-cells. The BH sections 710, 714 are partitioned to generate the BGH sub-cells. The BV sections 718, 722 are partitioned to generate the BGV sub-cells. The TAP section 726 is partitioned to produce the TAP sub-cells. The ACT sections 728, 730 are each partitioned to generate the CP280 (or CP (CH)) and CN280 (CN (CH)) sub-cells.

Figure 9:
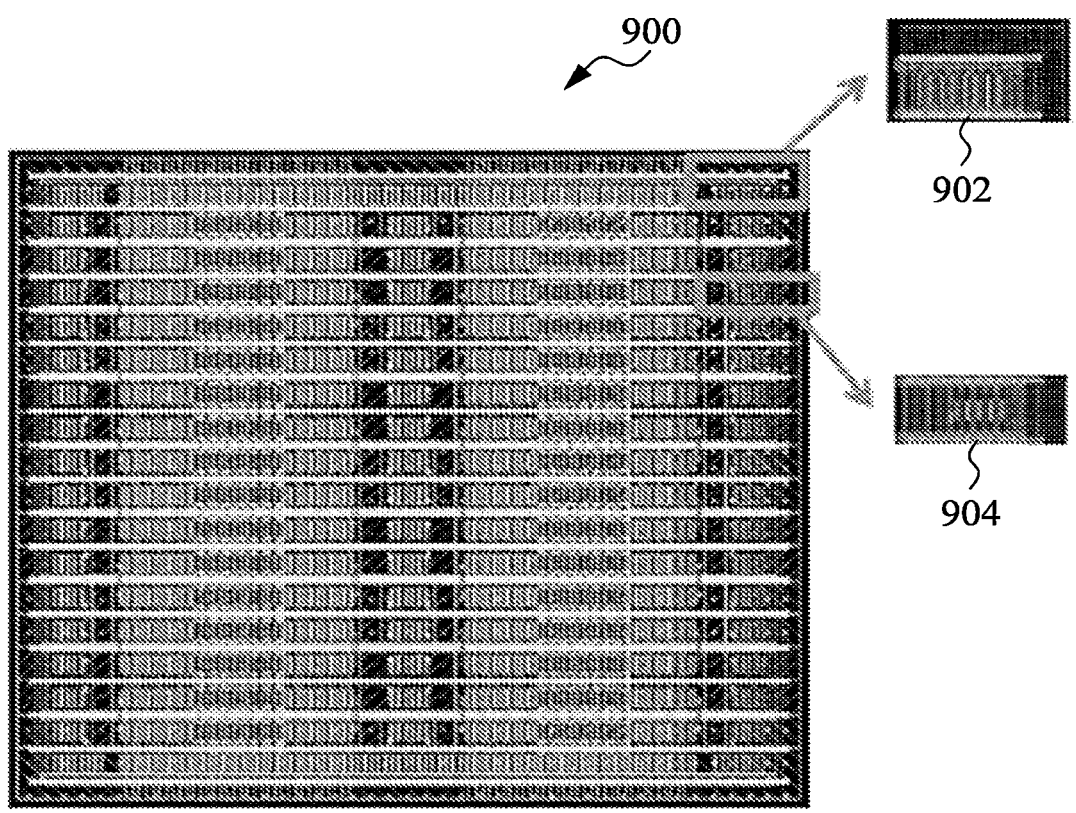
FIG. 9 illustrates an example physical layout of an analog integrated circuit in accordance with some embodiments.

FIG. 9 depicts an example physical layout of an analog integrated circuit in accordance with some embodiments. The physical layout 900 corresponds to the table 800 shown in FIG. 8. An example partitioned BGC sub-cell 902 and a BGV sub-cell 904 are shown.

Figure 10:
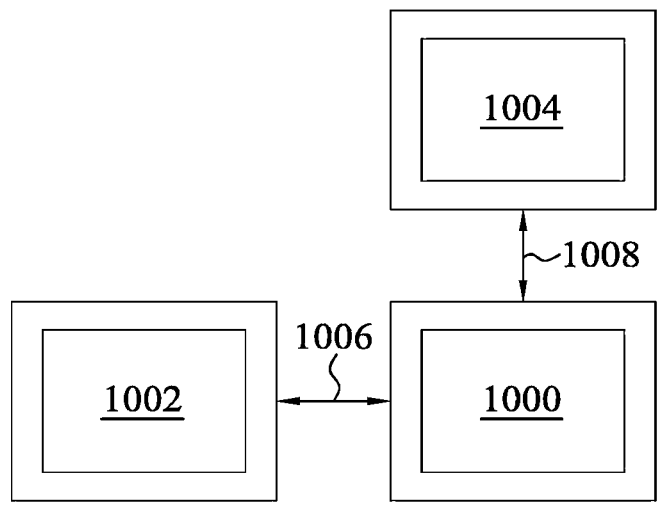
FIG. 10 depicts adjacent cells in an analog integrated circuit in accordance with some embodiments.

Determining the minimum spacing for the cells in the layout of the analog IC can be part of the process of generating device specifications for an analog IC. FIG. 10 illustrates adjacent cells in an analog integrated circuit in accordance with some embodiments. The analog cell 1000 is immediately adjacent the analog cell 1002 in the horizontal direction (e.g., x direction) and immediately adjacent the analog cell 1004 in the vertical direction (e.g., y direction). The cell type of the analog cell 1000 is a first cell type and the cell type of the analog cells 1002, 1004 is a different second cell type. The analog cells 1002, 1004 have the same cell type and that cell type is different from the cell type of the analog cell 1000.

To decrease or minimize the amount of wasted space on a die, the allowable minimum spacing for the first spacing 1006 and the second spacing 1008 are determined. The first spacing 1006 is the area between the analog cell 1000 and the analog cell 1002 in the horizontal direction, where the analog cells 1000, 1002 are of different cell types. The second spacing 1008 is the area between the analog cell 1000 and the analog cell 1004 in the vertical direction, where the analog cells 1000, 1004 are of different cell types.

Figure 11:
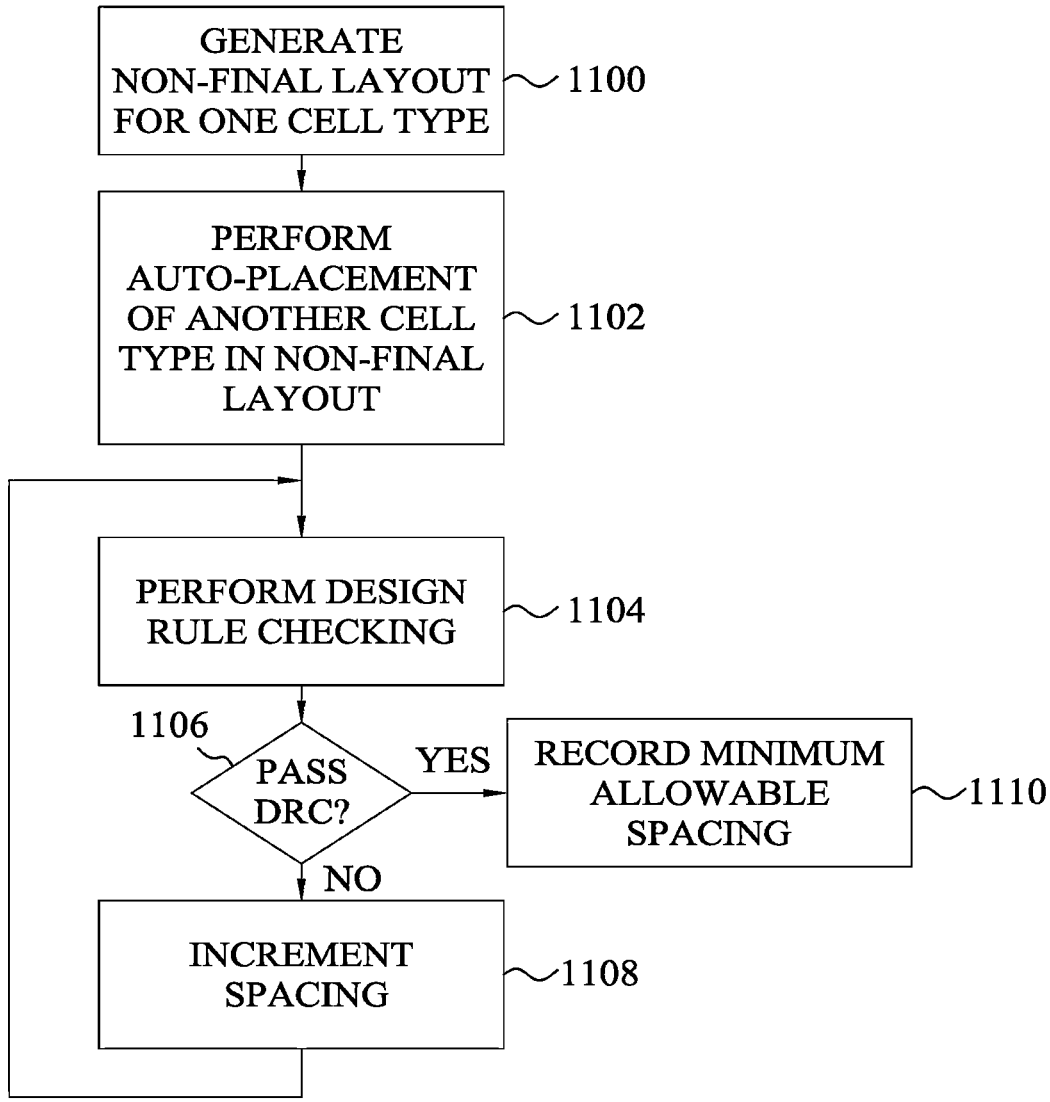
FIG. 11 illustrates a flowchart of an example method of determining the minimum spacing for cells in accordance with some embodiments.

FIG. 11 depicts a flowchart of an example method of determining the minimum spacing for cells in accordance with some embodiments. Although FIG. 11 is described in conjunction with the two cell types shown in FIG. 10, other embodiments are not limited to this implementation. The process shown in FIG. 11 can be performed for any number of different cell types.

Initially, as shown in block 1100, a non-final layout is generated for one cell type. In one embodiment, the non-final layout is generated using the device specifications and the pre-defined TAP, first metal layer (MO) plan, and via position information. Next, an auto-placement operation is performed for another cell type in the non-final layout (block 1102). The auto-placement operation assigns locations for the various components in the other cell type. In an example embodiment, the auto-placement operation initially sets the default spacing to zero and the analog cells directly abut one another. For example, the operation in block 1100 can be performed for the cell type associated with the analog cell 1000 and the operation in block 1102 may be performed for the different cell type associated with the analog cells 1002, 1004 (see FIG. 10).

DRC is performed on the non-final layout at block 1104. The DRC is configured to determine if the spacing between the different cell types (e.g., the spacing between the analog cell 1000 and the analog cells 1002, 1004) meet the design rules for the analog IC. A determination is made at block 1106 as to whether the spacing in the non-final layout passes the DRC. If not, the process passes to block 1108 where at least one spacing between the analog cells is incremented. In one embodiment, the spacing is incremented by the grid. For example, the spacing in the vertical direction can be incremented by a fin-pitch grid and the spacing in the horizontal direction may be incremented by a minimum CPP for that cell. The method then returns to block 1104 and blocks 1104, 1106 repeat until the non-final layout passes the DRC.

When a determination is made at block 1106 that the non-final layout passes the DRC, the process continues at block 1110 where the minimum allowable spacing is recorded. In one embodiment, the minimum allowable spacing is recording in an abutment guideline that is included in the device specifications.

Figure 12:
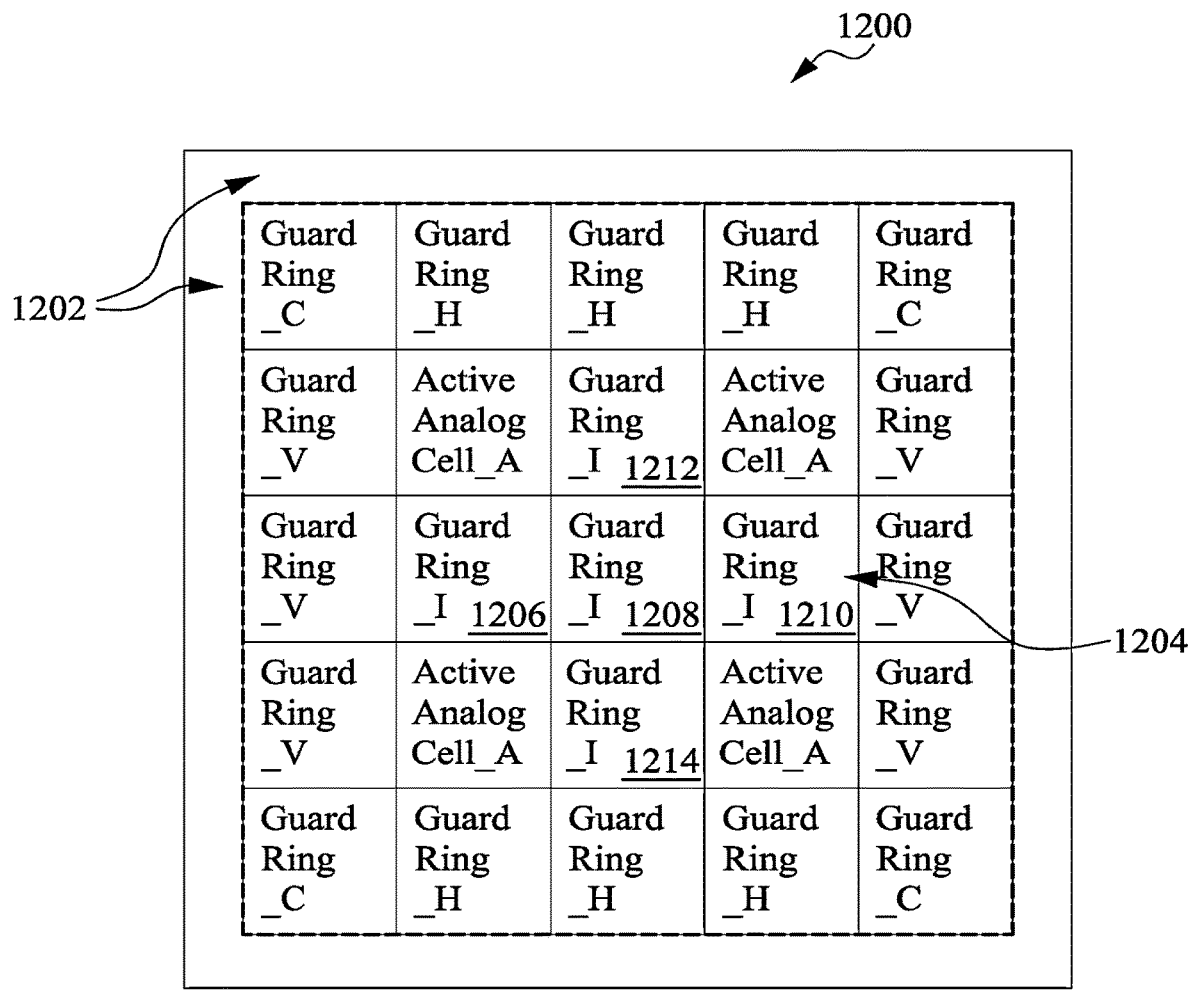
FIG. 12 depicts an example block diagram of a non-final layout of an analog integrated circuit in accordance with some embodiments.

FIG. 12 illustrates an example block diagram of a non-final layout of an analog integrated circuit in accordance with some embodiments. The non-final layout 1200 includes cells surrounded by a buffer zone 1202. The cells are of different cell types. The cell types include Guard Ring_C (BC cell type), Guard Ring_V (BV cell type), Guard Ring_H (BH cell type), and Active Analog Cell_A (ACT cell type). In the illustrated embodiment, the non-final layout includes a filler zone 1204. Filler cells (Guard Ring_I) 1206, 1208, 1210, 1212, 1214 are inserted into the filler zone 1204. Although certain numbers of Guard Ring_C, Guard Ring_V, Guard Ring_H, Active Analog Cell_A, and filler cells (Guard Ring_I) are shown in FIG. 12, other embodiments are not limited to this implementation. Additionally, the shape of the filler zone 1204 is shown as a cross or plus shape. The shape of the filler zone can have any suitable shape in other embodiments. For example, the shape of a filler zone 1204 may be a square, a rectangle, a rectangle elongated along the horizontal or vertical direction (e.g., along a row or a column), an "L" shape, or a "T" shape.

In one embodiment, the filler cells 1206, 1208, 1210, 1212, 1214 are inserted as a result of a change to the non-final layout. The change can be described in an engineering change order or other document that requests and/or records design changes. Thus, the number and/or placement of the filler cells can change over time (e.g., for each change or for select changes). A filler cell can include one or more components that are included in an active cell, but the component(s) are not used or operating in the filler cell. Alternatively, a filler cell can be an empty area that is devoid of any components.

Figure 13:
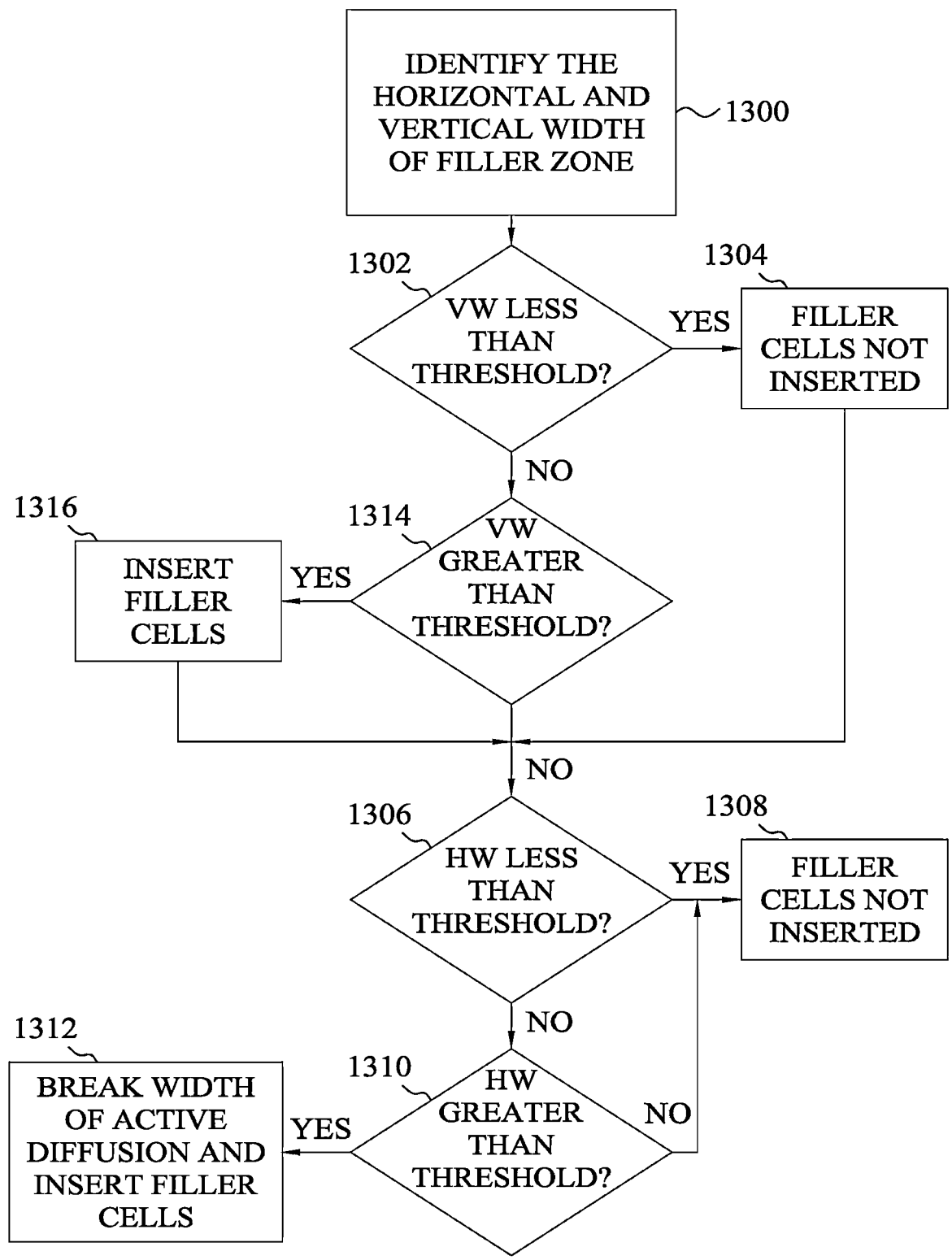
FIG. 13 illustrates a flowchart of a method of inserting filler cells into a non-final layout of an analog integrated circuit in accordance with some embodiments.

FIG. 13 depicts a flowchart of a method of inserting filler cells into a non-final layout of an analog IC in accordance with some embodiments. The process shown in FIG. 13 can be part of the process of generating a non-final layout for an analog IC. As noted earlier, the method can be performed for each design change to the analog IC or for select design changes.

Initially, as shown in block 1300, the horizontal and vertical widths of a filler zone are determined. The filler zone is an inner area of the layout that can include one or more filler cells. For example, as shown in FIG. 12, the filler zone is a cross or plus shaped filler zone 1204 that includes the filler cells (Guard Ring_I) 1206, 1208, 1210, 1212, 1214. The horizontal width of the filler zone 1204 is the combined widths of the filler cells 1206, 1208, 1210 since the horizontal width of the filler zone 1204 is shown with the filler cells 1206, 1208, 1212. The vertical width of the filler zone 1204 is the combined widths of the filler cells 1208, 1212, 1214 since the vertical width of the filler zone 1204 is shown with the filler cells 1208, 1212, 1214. In some embodiments, the horizontal and the vertical widths are determined when the filler zone 1204 does not include any filler cells.

A determination is then made at block 1302 as to whether the vertical width (VW) of the filler zone is less than a first vertical threshold width. In a non-limiting example, the first vertical threshold width is fifteen micrometers. If so, the process passes to block 1304 where filler cells are not inserted into the filler zone.

After block 1304, the method continues at block 1306 where a determination is made as to whether a horizontal width of the filler zone is less than a first horizontal threshold width. If so, the process passes to block 1308 where filler cells are not inserted into the filler zone. When a determination is made at block 1306 that the horizontal width of the filler zone is not less than the first horizontal threshold width, the method continues at block 1310 where a determination is made as to whether the horizontal width of the filler zone is greater than a second horizontal threshold width. In a non-limiting example, the second horizontal threshold width is sixty micrometers. If the horizontal width of the filler zone is not greater than the second horizontal threshold width, the process passes to block 1308 where filler cells are not inserted into the filler zone.

When a determination is made at block 1310 that the horizontal width of the filler zone is greater than the second horizontal threshold width, the method continues at block 1312 where the width of an active diffusion region is broken and one or more filler cells are inserted into the filler zone. In one embodiment, the width of the active diffusion region is broken evenly and one or more filler cells are inserted along the vertical direction (e.g., along the y direction) in the filler zone.

When a determination is made at block 1302 that the vertical width of the filler zone is not less than the first vertical threshold width, the process passes to block 1314 where a determination is made as to whether the vertical width is greater than a second vertical threshold width. If not, the method continues at block 1306. When the vertical width of the filler zone is greater than the second vertical threshold width, the process passes to block 1316 where one or more filler cells are inserted into the filler zone. In a non-limiting example, a filler cell may be inserted horizontally at the center of the filler zone every N micrometers (e.g., every fifteen micrometers). The method continues at block 1306 after block 1316.

Other embodiments can add, modify, omit, and/or change the order of the blocks shown in FIG. 13. For example, block 1314 can be omitted and the method passes to block 1316 when the vertical width is not less than the first vertical threshold width (e.g., the vertical width is greater than the first vertical threshold width). Additionally or alternatively, the operations in blocks 1306, 1308, 1310, and 1312 can be performed prior to the operation in block 1302. In some embodiments, block 1306 may be omitted and the process passes to block 1310 after blocks 1304, 1314, and 1316.

Figure 14:
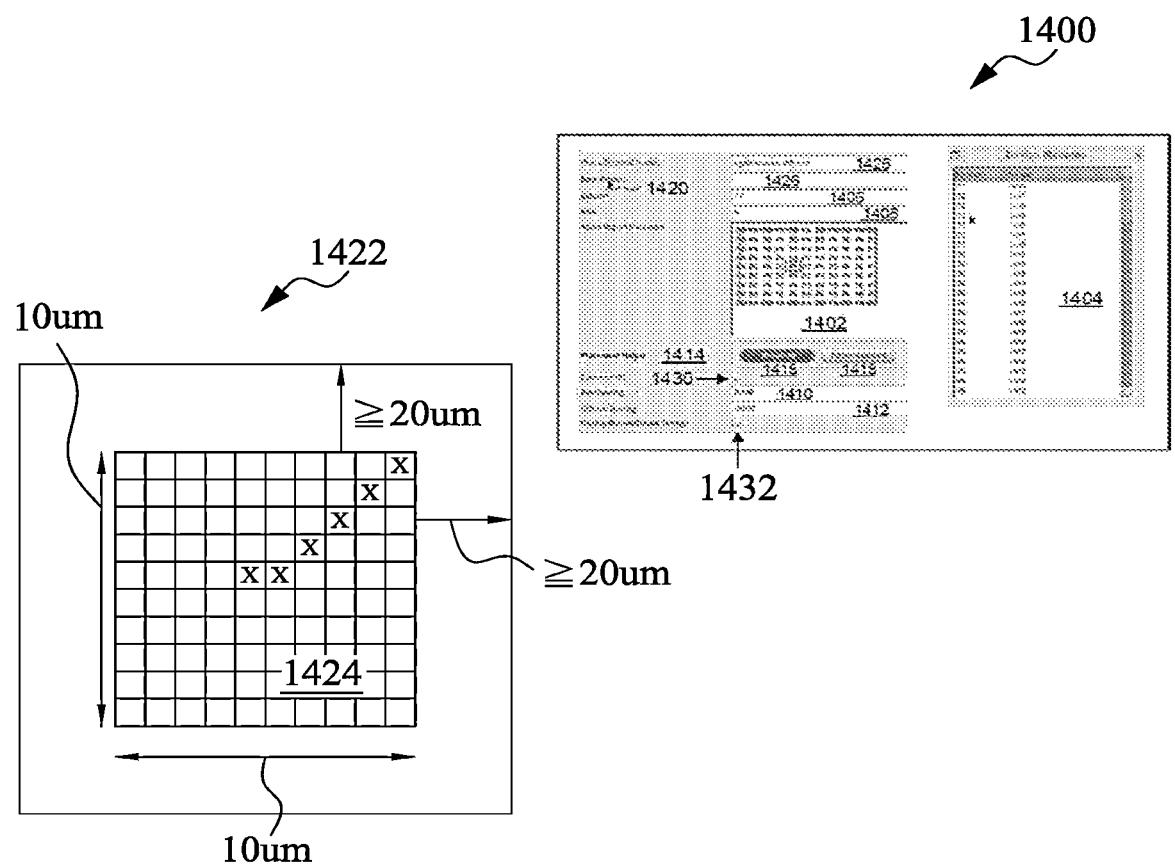
FIG. 14 depicts an example graphical user interface that is suitable for use when generating a non-final layout in accordance with some embodiments.

FIG. 14 illustrates an example graphical user interface that is suitable for use when generating a non-final layout in accordance with some embodiments. The user interface 1400 includes a cell placement view 1402, a device mapping view 1404, a column entry field 1406, a row entry field 1408, a row spacing entry field 1410, and a column spacing entry field 1412. A number of columns is entered in the column entry field 1406 for generation or re-generation of the non-final layout. A number of rows is entered in the row entry field 1408 for generation or re-generation of the non-final layout. A spacing distance for the rows is entered in the row spacing entry field 1410 for generation or re-generation of the non-final layout. A spacing distance for the columns is entered in the column spacing entry field 1412 for generation or re-generation of the non-final layout.

The user interface 1400 may include a placement helper option 1414 that, when selected, causes information on the non-final layout to be displayed and/or provides a layout pattern assistant that can generate suggestions for the placement of cells in the non-final layout and/or place one or more cells in the non-final layout. A selectable element 1416 is displayed for the "show information" option and a selectable element 1418 is presented for the "Pattern Assistant" option. When one or both of the selectable elements 1416, 1418 are selected, the option is presented in the user interface 1400 or in a separate user interface or view (not shown). Any suitable technique can be used to select the selectable elements 1416, 1418. In a non-limiting example, an input device, such as a mouse, can be used to position a cursor 1420 over a respective selectable element 1416, 1418 and a button on the input device is pressed to select the selectable element 1416, 1418. Alternatively, an input device, such as a stylus, may be positioned over a respective selectable element 1416, 1418 and pressed onto the selectable element 1416, 1418.

The cell placement view 1402 can be configured to enable a user to select one or more cells in the cell placement. In some embodiments, a separate user interface or view 1422 is presented in response to the selection of one or more cells in the cell placement view 1402. The user interface or view 1422 can display an enlarged section 1424 of the cell placement view 1402. In a non-limiting example, the selected cells are cells in which information is to be displayed (e.g., using selectable element 1416) and/or are cells having circuits or components that are to be monitored.

The device mapping view 1404 displays the mapping of the cells to particular components or circuits. In the illustrated embodiment, the device mapping presents a relationship between a component or a circuit (represented by a unique name or number in the "Device" column) and the symbol that represents the component or circuit (e.g., P1-P7). The user interface 1400 can include a base pattern entry field 1426 that can be used to select (e.g., via a drop-down menu) and/or enter a base pattern type (e.g., an initial pattern). Characteristics of the base pattern type, such as the number of columns, the number of rows, the row spacing and/or the column spacing can be modified using the respective entry fields 1406, 1408, 1410, 1412.

Additionally or alternatively, the user interface 1400 may include a check terminal names entry field 1428 that can be used to check one or more names of the terminals in the non-final layout. For example, the terminal names in the non-final layout can be confirmed to match the terminal names in the device specification. The user interface 1400 can also include an input element 1430 (e.g., checkbox) that, when selected, enables a user to indicate the non-final layout is in a common active diffusion region (or OD region). In some embodiments, the user interface 1400 includes an input element 1432 (e.g., checkbox) that, when selected, enables the settings of the dummy device(s) (e.g., the filler cells) to be displayed.

Other embodiments are not limited to the configuration of the user interface 1400 shown in FIG. 14. Embodiments can include some or all of the views, entry fields, and selectable elements. Additionally, new views, entry fields, and selectable elements can be provided. For example, selectable elements to provide the non-final layout to an output device and/or to transmit the data of the user interface to a computing device or storage device can be included in the user interface. Additionally or alternatively, some or all of the data entry fields can be implemented differently. For example, the row spacing 1410 and the column spacing 1412 can be configured as drop-down menus that enable the user to select the row and column spacings from pre-set row and column spacings. The selectable elements 1416, 1418 may be radio buttons, check boxes, or toggle buttons instead of the example text buttons.

Figure 15:
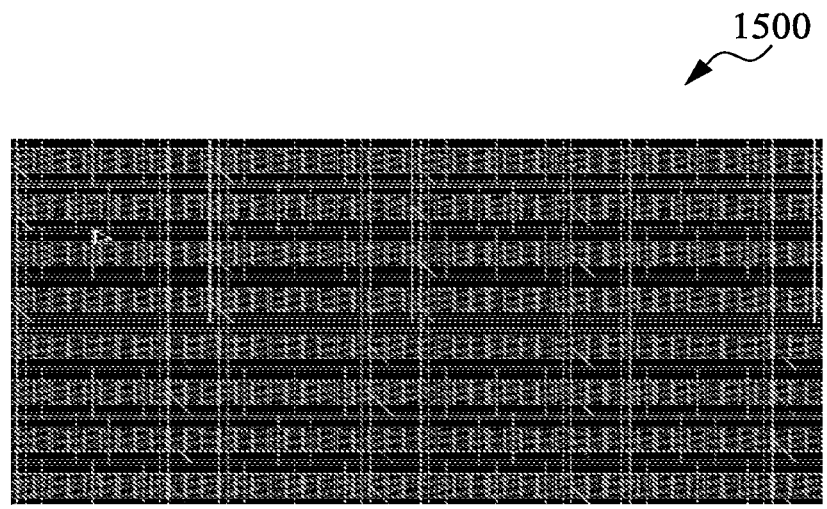
FIG. 15 illustrates an example non-final layout generated based on entries in the user interface shown in FIG. 14 in accordance with some embodiments.

FIG. 15 depicts an example non-final layout generated based on entries in the user interface shown in FIG. 14 in accordance with some embodiments. The non-final layout 1500 may be provided to an output device. For example, the non-final layout 1500 may be displayed on a display device and/or printed by a printer.

In some embodiments, a design for an analog integrated circuit is provided by a computer system such as an Electronic Computer-Aided Design (ECAD) system. ECAD tools and methods facilitate the design, partition, and placement of circuits and/or components in an analog integrated circuit on a semiconductor substrate (or other suitable substrate). The ECAD process typically includes turning a behavioral description of an analog integrated circuit into a functional description, which is then decomposed into logic functions and mapped into cells that implement the logic or other electronic functions. The cells are typically stored in a cell library. Once mapped, a synthesis is performed to turn the structural design into a physical layout. In some instances, the design may be optimized post layout.

Figure 16:
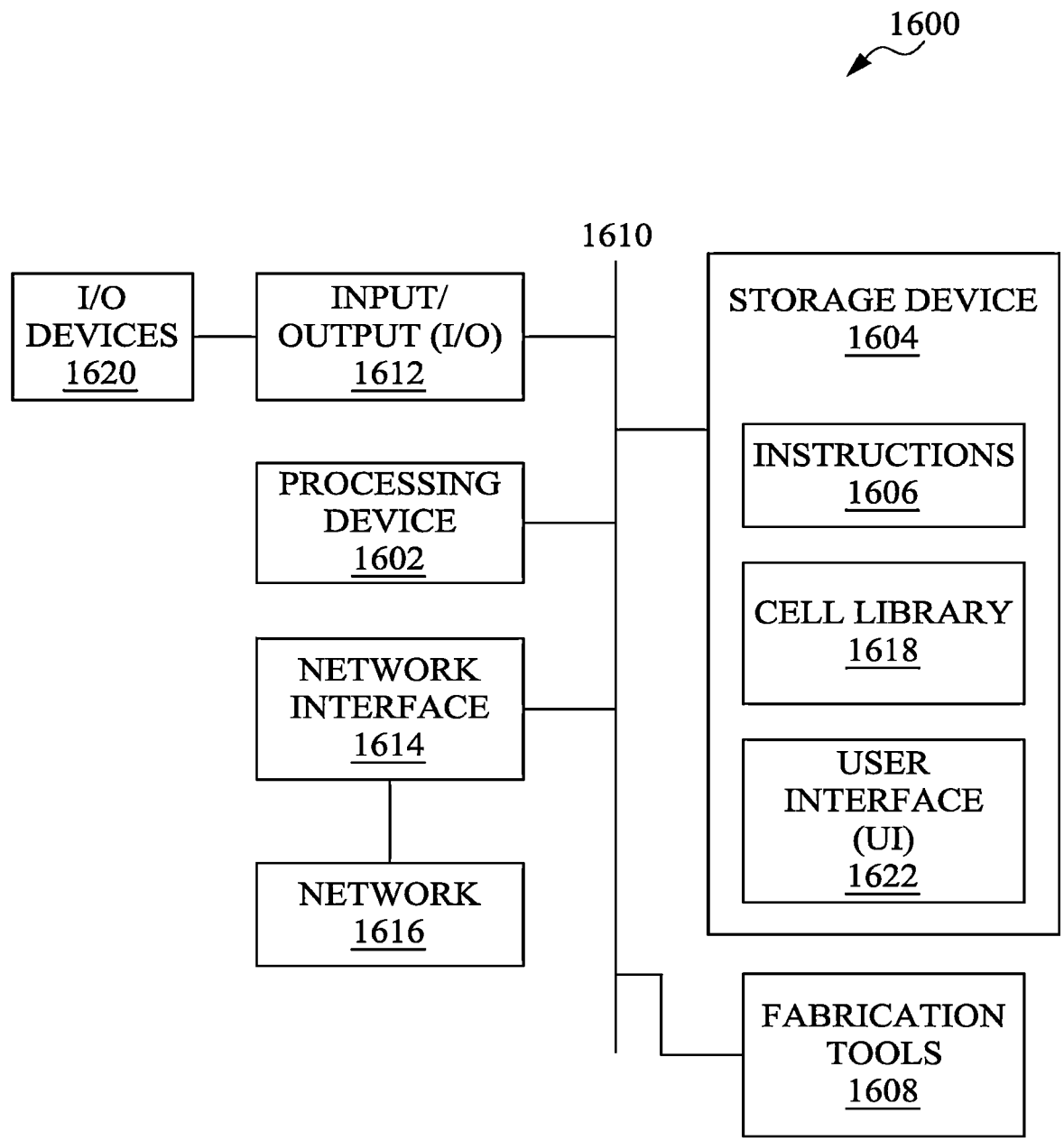
FIG. 16 depicts an example system that is suitable for designing an integrated circuit in accordance with some embodiments.

FIG. 16 illustrates an example system that is suitable for generating sub-cells and designing an integrated circuit in accordance with some embodiments. The design process may be implemented by a computer system, such as an ECAD system. Some or all of the operations for design (e.g., layout) methods disclosed herein are capable of being performed as part of a design procedure performed in a design house, such as the design house 1802 discussed below in conjunction with FIG. 18.

In some embodiments, the system 1600 includes an automated place and route (APR) system. In some embodiments, the system 1600 includes a processing device 1602 and a non-transitory, computer-readable storage medium 1604 ("storage device"). The processing device 1602 is any suitable processing device or processing devices. Example processing devices include, but are not limited to, a central processing unit, a microprocessor, a distributed processing system, an application specific integrated circuit, a graphics processing unit, a field programmable gate array, or combinations thereof.

The storage device 1604 may be encoded with or store, for example, computer program code (e.g., a set of executable instructions 1606). Execution of the executable instructions 1606 by the processing device 1602 represents (at least in part) an ECAD tool that implements a portion or all of, the methods described herein to produce the designs for the structures and the ICs disclosed herein. Further, the fabrication tools 1608 may be included for layout and physical implementation of the ICs. In one or more embodiments, the storage device 1604 is a non-transitory electronic, magnetic, optical, electromagnetic, infrared, and/or a semiconductor system (or apparatus or device). For example, the storage device 1604 includes a semiconductor or solid-state memory, a magnetic tape, a removable computer diskette, a random-access memory (RAM), a read-only memory (ROM), a rigid magnetic disk, and/or an optical disk. In one or more embodiments using optical disks, the storage device 1604 includes a compact disk-read only memory (CD-ROM), a compact disk-read/write (CD-R/W), and/or a digital video disc (DVD).

The processing device 1602 is operably connected to the storage device 1604 via a bus 1610. The processing device 1602 is also operably connected to an input/output (I/O) interface 1612 and a network interface 1614 by the bus 1610. The network interface 1614 is operably connected to a network 1616 so that the processing device 1602 and the storage device 1604 are capable of connecting to external elements via the network 1616. In one or more embodiments, the network 1616 is illustrative of any type of wired and/or wireless network, such as an intranet and/or a distributed computing network (e.g., the Internet).

The network interface 1614 allows the system 1600 to communicate with other computing or electronic devices (not shown) via the network 1616. The network interface 1614 includes wireless network interfaces and/or wired network interfaces. Example wireless network interfaces include BLUETOOTH, WIFI, WIMAX, GPRS, or WCDMA. Example wired network interfaces include ETH- ERNET, USB, or IEEE-1364. In one or more embodiments, some or all of the processes and/or methods disclosed herein are implemented in a distributed system via the network 1616.

The processing device 1602 is configured to execute the executable instructions 1606 encoded in the storage device 1604 to cause the system 1600 to be usable for performing some or all of the processes and/or methods described herein. For example, an electronic design application (e.g., in an ECAD system or as a standalone application) can be configured to perform the methods and techniques shown in FIGS. 1-15. Given the complexity of integrated circuits, and since integrated circuits include thousands, millions, or billions of components, the human mind is unable to perform the methods and techniques depicted in FIGS. 1-15. Unlike the human mind, an electronic design application is able to perform the operations associated with FIGS. 1-15.

In one or more embodiments, the storage device 1604 stores the executable instructions 1606 configured to cause the system 1600 to be usable for performing some or all of the processes and/or methods. In one or more embodiments, the storage device 1604 also stores information that facilitates execution of a portion of or all of the processes and/or methods. In one or more embodiments, the storage device 1604 stores a cell library 1618 that includes (at least in part) standard and/or previously designed cells.

The I/O interface 1612 is operably connected to I/O devices 1620. In one or more embodiments, the I/O devices 1620 include one or more of an image capture device, a microphone, a scanner, a keyboard, a keypad, a mouse, a trackpad, a touchscreen, and/or cursor direction keys for communicating information and commands to the processing device 1602. The I/O devices 1620 may also include one or more displays, one or more speakers, a printer, headphones, a haptic or tactile feedback device, and the like.

The system 1600 is configured to receive information through the I/O interface 1612. The information received through the I/O interface 1612 includes one or more of instructions, data, design rules, cell libraries, and/or other parameters for processing by the processing device 1602. The information is transferred to the processing device 1602 via the bus 1610. The system 1600 is configured to receive information related to a user interface (UI) through the I/O interface 1612. The information is stored in the storage device 1604 as a UI 1622 or for presentation in the UI 1622.

In some embodiments, a portion or all of the processes and/or methods is implemented as a standalone software application (e.g., an EDA) for execution by a processing device (e.g., processing device 1602). In some embodiments, a portion or all of the processes and/or methods is implemented as a software application that is a part of an additional software application. In some embodiments, a portion or all of the processes and/or methods is implemented as a plug-in to a software application. In some embodiments, at least one of the processes and/or methods is implemented as a software application that is a portion of an EDA tool. In some embodiments, a portion or all of the processes and/or methods is implemented as a software application that is used by the system 1600. In some embodiments, a layout diagram which includes standard and/or previously designed cells is generated using a tool such as VIRTUOSO available from CADENCE DESIGN SYSTEMS, Inc., or another suitable layout generating tool.

In some embodiments, the processes are realized as functions of a program stored in a non-transitory computer readable recording medium (e.g., the storage device 1604). Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

As noted above, embodiments of the system 1600 may include the fabrication tools 1608 for implementing the processes and/or methods stored in the storage device 1604. For instance, a synthesis may be performed on a design in which the behavior and/or functions desired from the design are transformed to a functionally equivalent logic gate-level circuit description by matching the design to cells selected from the cell library 1618. The synthesis results in a functionally equivalent logic gate-level circuit description, such as a gate-level netlist. Based on the gate-level netlist, a photolithographic mask may be generated that is used to fabricate the analog integrated circuit by the fabrication tools 1608. Further aspects of device fabrication are disclosed in conjunction with FIG. 18, which is a block diagram of an integrated circuit manufacturing system, and a manufacturing flow associated therewith, in accordance with some embodiments. In some embodiments, based on a layout diagram, at least one of: (a) one or more semiconductor masks; or (b) at least one component in a layer of a semiconductor integrated circuit is fabricated using the manufacturing system 1800.

Figure 17:
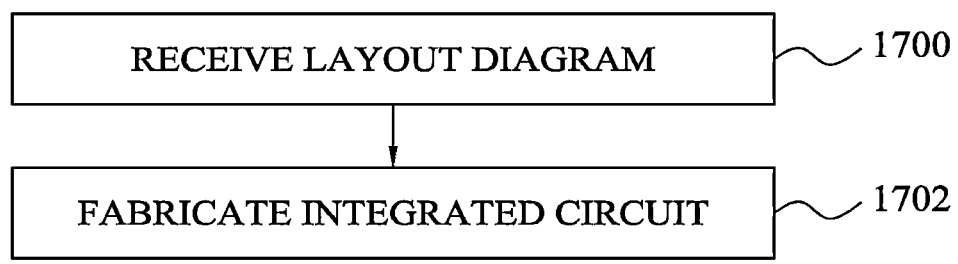
FIG. 17 illustrates a block diagram of an example integrated circuit manufacturing system and manufacturing flow in accordance with some embodiments.

FIG. 17 depicts a flowchart of an example method of fabricating an analog integrated circuit. Initially, as shown in block 1700, a layout diagram of an analog integrated circuit is received. In some embodiments, the layout diagram is generating using one or more operations shown in FIGS. 1-15. For example, the layout diagram can be the final layout diagram produced at block 110 in FIG. 1. Based on the received layout diagram, the analog integrated circuit is fabricated at block 1702.

Figure 18:
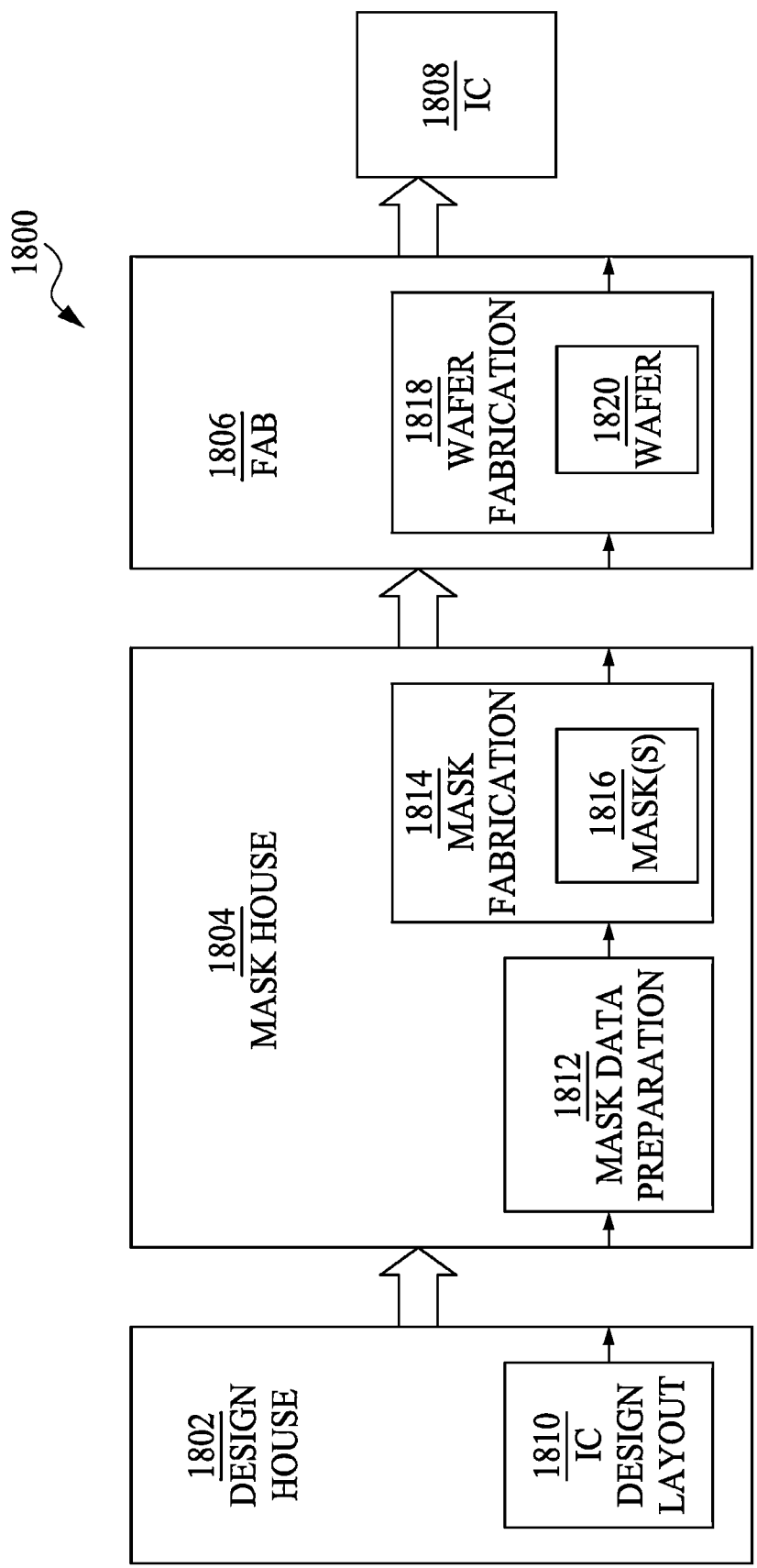
FIG. 18 depicts a block diagram of an example integrated circuit manufacturing system and manufacturing flow in accordance with some embodiments.

FIG. 18 illustrates a block diagram of an example integrated circuit manufacturing system and manufacturing flow in accordance with some embodiments. The IC manufacturing system 1800 includes entities, such as a design house 1802, a mask house 1804, and an IC manufacturer/fabricator ("fab") 1806, that interact with one another in the design, development, and manufacturing cycles and/or services related to manufacturing an integrated circuit (IC) 1808, such as the ICs disclosed herein. The entities in the system 1800 are operably connected by a communication network (not shown). In some embodiments, the communication network is a single network. In other embodiments, the communication network is a variety of different networks, such as an intranet and the Internet. The communication network includes wired and/or wireless communication channels.

Each entity interacts with one or more of the other entities and provides services to and/or receives services from one or more of the other entities. In some embodiments, two or more of the design house 1802, the mask house 1804, and the IC fab 1806 is owned by a single company. In some embodiments, two or more of the design house 1802, the mask house 1804, and the IC fab 1806 coexist in a common facility and use common resources.

The design house (or design team) 1802 generates an IC design layout diagram 1810. The IC design layout diagram 1810 includes various geometrical patterns, or IC layout diagrams designed for the IC 1808 to be fabricated. The geometrical patterns correspond to patterns of metal, oxide, or semiconductor layers that make up the various components of the IC 1808 to be fabricated. The various layers combine to form various IC features. For example, a portion of the IC design layout diagram 1810 includes various IC features, such as active regions, gate electrodes, source and drain, conductive lines or local vias, and openings for bonding pads, to be formed in a semiconductor substrate (such as a silicon wafer) and various material layers disposed on the semiconductor substrate.

The design house 1802 implements a design procedure to form the IC design layout diagram 1810. The design procedure includes one or more of logic design, physical design or place and route. The IC design layout diagram 1810 is presented in one or more data files having information of the geometrical patterns. For example, the IC design layout diagram 1810 can be expressed in a GDS file format, a GDSII file format, or a DFII file format.

The mask house 1804 includes mask data preparation 1812 and mask fabrication 1814. The mask house 1804 uses the IC design layout diagram 1810 to manufacture one or more masks 1816 to be used for fabricating the various layers of the IC 1808 according to the IC design layout diagram 1810. The mask house 1804 performs mask data preparation 1812, where the IC design layout diagram 1810 is translated into a representative data file ("RDF"). The mask data preparation 1812 provides the RDF to the mask fabrication 1814. The mask fabrication 1814 includes a mask writer (not shown) that converts the RDF to an image on a substrate, such as a mask (reticle) 1816 on a semiconductor wafer. The IC design layout diagram 1810 is manipulated by the mask data preparation 1812 to comply with particular characteristics of the mask writer and/or requirements of the IC fab 1806. In FIG. 18, the mask data preparation 1812 and the mask fabrication 1814 are illustrated as separate elements. In some embodiments, the mask data preparation 1812 and the mask fabrication 1814 can be collectively referred to as a mask data preparation.

In some embodiments, the mask data preparation 1812 includes an optical proximity correction (OPC) that uses lithography enhancement techniques to compensate for image errors, such as those that can arise from diffraction, interference, other process effects and the like. The OPC adjusts the IC design layout diagram 1810. In some embodiments, the mask data preparation 1812 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 1812 includes a mask rule checker (MRC) (not shown) that checks the IC design layout diagram 1810 that has undergone processes in OPC with a set of mask creation rules that contain certain geometric and/or connectivity restrictions to ensure sufficient margins, to account for variability in semiconductor manufacturing processes, and the like. In some embodiments, the MRC modifies the IC design layout diagram 1810 to compensate for limitations during the mask fabrication, which may undo part of the modifications performed by OPC in order to meet mask creation rules.

In some embodiments, the mask data preparation 1812 includes lithography process checking (LPC) (not shown) that simulates processing that will be implemented by the IC fab 1806 to fabricate the IC 1808. LPC simulates this processing based on the IC design layout diagram 1810 to create a simulated manufactured device, such as the IC 1808. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, and if the simulated device is not sufficiently close in shape to satisfy design rules, OPC and/or MRC are be repeated to further refine the IC design layout diagram 1810.

It should be understood that the above description of the mask data preparation 1812 has been simplified for the purposes of clarity. In some embodiments, the mask data preparation 1812 includes additional features such as a logic operation (LOP) to modify the IC design layout diagram 1810 according to manufacturing rules. Additionally, the processes applied to the IC design layout diagram 1810 during the mask data preparation 1812 may be executed in a variety of different orders.

After the mask data preparation 1812 and during the mask fabrication 1814, a mask 1816 or a group of masks 1816 are fabricated based on the IC design layout diagram 1810. In some embodiments, the mask fabrication 1814 includes performing one or more lithographic exposures based on the IC design layout diagram 1810. In some embodiments, an electron-beam (e-beam) or a mechanism of multiple e-beams is used to form a pattern on a mask(s) 1816 (photomask or reticle) based on the IC design layout diagram 1810. The mask(s) 1816 can be formed in various technologies. For example, in some embodiments, the mask(s) 1816 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of the mask(s) 1816 includes a transparent substrate (e.g., fused quartz) and an opaque material (e.g., chromium) coated in the opaque regions of the binary mask.

In another example, the mask(s) 1816 is formed using a phase shift technology. In a phase shift mask (PSM) version of the mask(s) 1816, various features in the pattern formed on the phase shift mask are configured to have a proper phase difference to enhance the resolution and imaging quality. In various examples, the phase shift mask can be attenuated PSM or alternating PSM. The mask(s) 1816 generated by the mask fabrication 1814 is used in a variety of processes. For example, a mask(s) 1816 is used in an ion implantation process to form various doped regions in the semiconductor wafer, in an etching process to form various etching regions in the semiconductor wafer, and/or in other suitable processes.

The IC fab 1806 includes wafer fabrication 1818. The IC fab 1806 is an IC fabrication business that includes one or more manufacturing facilities for the fabrication of a variety of different IC products. In some embodiments, the IC fab 1806 is a semiconductor foundry. For example, there may be a manufacturing facility for the front end fabrication of a plurality of IC products (FEOL fabrication), while a second manufacturing facility may provide the back end fabrication for the interconnection and packaging of the IC products (BEOL fabrication), and a third manufacturing facility may provide other services for the foundry business.

The IC fab 1806 uses the mask(s) 1816 fabricated by the mask house 1804 to fabricate the IC 1808. Thus, the IC fab 1806 at least indirectly uses the IC design layout diagram 1810 to fabricate the IC 1808. In some embodiments, a semiconductor wafer 1820 is fabricated by the IC fab 1806 using the mask(s) 1816 to form the IC 1808. In some embodiments, the IC fab 1806 includes performing one or more lithographic exposures based at least indirectly on the IC design layout diagram 1810. The semiconductor wafer 1820 includes a silicon substrate or other proper substrate having material layers formed thereon. The semiconductor wafer 1820 further includes one or more of various doped regions, dielectric features, multilevel interconnects, and the like (formed at subsequent manufacturing steps).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In one aspect, a method includes a processing device receiving device specifications for an analog integrated circuit. Based on the device specifications, the processing device generates a non-final layout of the analog integrated circuit. The processing device partitions the non-final layout into sub-cells and performs one or more quality control checks on each sub-cell in the sub-cells to produce verified sub-cells. The processing device then merges the verified sub-cells into a merged layout of the analog integrated circuit. The processing device performs one or more quality control checks on the merged layout to produce a verified merged layout.

In another aspect, a system includes a processing device and a memory operably connected to the processing device. The memory stores instructions that when executed by the processing device, cause operations to be performed. The operations include receiving device specifications for an analog integrated circuit and generating a non-final layout of the analog integrated circuit using the device specifications. The non-final layout is partitioned into sub-cells, and one or more quality control checks are performed on each sub-cell in the sub-cells to produce verified sub-cells. The verified sub-cells are merged to produce a merged layout of the analog integrated circuit. One or more quality control checks are performed on the merged layout to produce a verified merged layout.

In yet another aspect, a method includes a processing device receiving device specifications for an analog integrated circuit. Based on the device specifications, the processing device generates a non-final layout of the analog integrated circuit. Generating the non-final layout can include one or more of the processing device determining an allowable spacing between a first cell of a first cell type and a second cell of a second cell type immediately adjacent the first cell, or inserting a filler cell into the non-final layout. The processing device partitions the non-final layout into sub-cells and performs one or more quality control checks on each sub-cell in the sub-cells to produce verified sub-cells. The processing device then merges the verified sub-cells into a merged layout of the analog integrated circuit. The processing device performs one or more quality control checks on the merged layout to produce a verified merged layout.

The description and illustration of one or more aspects provided in this application are not intended to limit or restrict the scope of the disclosure as claimed in any way. The aspects, examples, and details provided in this application are considered sufficient to convey possession and enable others to make and use the best mode of claimed disclosure. The claimed disclosure should not be construed as being limited to any aspect, example, or detail provided in this application. Regardless of whether shown and described in combination or separately, the various features (both structural and methodological) are intended to be selectively included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

What is claimed is:

1. A method, comprising:
  receiving, by a processing device, device specifications for an analog integrated circuit;
  generating, by the processing device, a non-final layout of the analog integrated circuit based on the device specifications, wherein generating the non-final layout comprises:
    determining, by the processing device, an allowable spacing between a first cell of a first cell type and a second cell of a second cell type immediately adjacent the first cell,
    wherein the determining the allowable spacing between the first cell of the first cell type and the second cell of the second cell type comprises:
      generating, by the processing device, the non-final layout for the first cell;
      placing, by the processing device, the second cell in the non-final layout;
      performing design rule checking on the non-final layout:
      determining, by the processing device, whether a spacing between the first cell and the second cell passes the design rule checking;
      incrementing, by the processing device, the spacing between the first cell and the second cell if the spacing fails the design rule checking; and
      repeating the performing the design rule checking on the non-final layout, the determining whether the spacing between the first cell and the second cell passes the design rule checking, and the incrementing the spacing between the first cell and the second cell if the spacing fails the design rule checking until the spacing passes the design rule checking;
  partitioning, by the processing device, the non-final layout into a plurality of sub-cells;
  performing, by the processing device, a quality control check on each sub-cell in the plurality of sub-cells to produce verified sub-cells;
  merging, by the processing device, the verified sub-cells to form a merged layout of the analog integrated circuit; and
  performing, by the processing device, a quality control check on the merged layout to produce a verified merged layout.

2. The method of claim 1, comprising recording the spacing between the first cell and the second cell if the spacing passes the design rule checking.

3. The method of claim 1, wherein incrementing the spacing between the first cell and the second cell includes incrementing the spacing in the vertical direction by a fin-pitch grid.

4. The method of claim 1, wherein incrementing the spacing between the first cell and the second cell includes incrementing the spacing in the horizontal direction by a minimum contact poly pitch.

5. The method of claim 1, comprising inserting, by the processing device a filler cell into the non-final layout including:
   determining, by the processing device, a horizontal width and a vertical width of a filler zone; and
   inserting the filler cell into the non-final layout if the vertical width is not less than a vertical threshold width or the horizontal width is greater than a horizontal threshold width.

6. The method of claim 1, comprising inserting, by the processing device, a filler cell into the non-final layout including:
   determining, by the processing device, a horizontal width and a vertical width of a filler zone; and
   determining whether the vertical width is less than a first vertical threshold width and if the vertical width is not less than the first vertical threshold width determining whether the vertical width is greater than a second vertical threshold width and if the vertical width is greater than the second vertical threshold width inserting the filler cell.

7. The method of claim 1, comprising inserting by the processing device, a filler cell into the non-final layout including:
   determining, by the processing device, a horizontal width and a vertical width of a filler zone; and
   determining whether the horizontal width is less than a first horizontal threshold width and if the horizontal width is not less than the first horizontal threshold width determining whether the horizontal width is greater than a second horizontal threshold width and if the horizontal width is greater than the second horizontal threshold width inserting the filler cell.

8. A method of determining spacing between cells, the method comprising:
   receiving, by a processing device, device specifications for an analog integrated circuit;
   generating, by the processing device, a non-final layout of the analog integrated circuit based on the device specifications, wherein generating the non-final layout includes:
   generating the non-final layout for first cells of a first cell type;
   performing placement for second cells of a second cell type in the non-final layout;
   performing design rule checking on the non-final layout that includes the first cells and the second cells;
   determining whether the non-final layout passes the design rule checking;
   recording spacing between the first cells and the second cells if the non-final layout passes the design rule checking;
   incrementing at least one spacing between the first cells and the second cells if the non-final layout fails to pass the design rule checking; and
   repeating the performing design rule checking on the non-final layout, the determining whether the non-final layout passes the design rule checking, and the incrementing the at least one spacing between the first cells and the second cells if the non-final layout fails to pass the design rule checking.

9. The method of claim 8, wherein if the non-final layout fails to pass the design rule checking the method includes the repeating the performing the design rule checking the determining whether the non-final layout passes the design rule checking, and the incrementing the at least one spacing between the first cells and the second cells until the non-final layout passes the design rule checking.

10. The method of claim 8, wherein performing placement for the second cells of the second cell type in the non-final layout includes initially setting the default spacing between the first cells and the second cells to zero, such that the first cells and the second cells directly abut one another.

11. The method of claim 8, wherein incrementing the at least one spacing between the first cells and the second cells includes incrementing the spacing in the vertical direction by a fin-pitch grid.

12. The method of claim 8, wherein incrementing the at least one spacing between the first cells and the second cells includes incrementing the spacing in the horizontal direction by a minimum contact poly pitch.

13. The method of claim 8, wherein generating, by the processing device, the non-final layout of the analog integrated circuit based on the device specifications includes:
   inserting, by the processing device, a filler cell into the non-final layout.

14. The method of claim 13, wherein inserting the filler cell into the non-final layout comprises:
   determining, by the processing device, a horizontal width and a vertical width of a filler zone; and
   determining whether the vertical width is less than a first vertical threshold width and if the vertical width is not less than the first vertical threshold width determining whether the vertical width is greater than a second vertical threshold width and if the vertical width is greater than the second vertical threshold width inserting the filler cell.

15. The method of claim 13, wherein inserting the filler cell into the non-final layout comprises:
   determining, by the processing device, a horizontal width and a vertical width of a filler zone; and
   determining whether the horizontal width is less than a first horizontal threshold width and if the horizontal width is not less than the first horizontal threshold width determining whether the horizontal width is greater than a second horizontal threshold width and if the horizontal width is greater than the second horizontal threshold width inserting the filler cell.

16. A method comprising:
   receiving, by a processing device, device specifications for the analog integrated circuit;
   generating, by the processing device, a non-final layout of the analog integrated circuit based on the device specifications, wherein generating the non-final layout includes:
   determining, by the processing device, an allowable spacing between a first cell of a first cell type and a second cell of a second cell type immediately adjacent the first cell, comprising:
   generating by the processing device, the non-final layout for the first cell;

placing, by the processing device, the second cell in the non-final layout;

performing design rule checking on the non-final layout;

determining, by the processing device, whether a spacing between the first cell and the second cell passes the design rule checking;

incrementing, by the processing device, the spacing between the first cell and the second cell if the spacing fails the design rule checking; and repeating the performing the design rule checking on the non-final layout, the determining whether the spacing between the first cell and the second cell passes the design rule checking, and the incrementing the spacing between the first cell and the second cell if the spacing fails the design rule checking until the spacing passes the design rule checking;

determining, by the processing device, a horizontal width and a vertical width of a filler zone; and inserting a filler cell into the non-final layout based on whether the vertical width is not less than a first vertical threshold width or whether the horizontal width is greater than a first horizontal threshold width.

17. The method of claim 16, comprising:
determining whether the vertical width is less than the first vertical threshold width; and
inserting the filler cell if the vertical width is not less than the first vertical threshold width.

18. The method of claim 16, comprising:
determining whether the vertical width is less than the first vertical threshold width and if the vertical width is not less than the first vertical threshold width determining whether the vertical width is greater than a second vertical threshold width and if the vertical width is greater than the second vertical threshold width inserting the filler cell.

19. The method of claim 16, comprising:
determining whether the horizontal width is greater than the first horizontal threshold width; and
inserting the filler cell if the horizontal width is greater than the first horizontal threshold width.

20. The method of claim 16, comprising:
determining whether the horizontal width is less than a second horizontal threshold width and if the horizontal width is not less than the second horizontal threshold width determining whether the horizontal width is greater than the first horizontal threshold width and if the horizontal width is greater than the first horizontal threshold width inserting the filler cell.

* * * * *